United States Patent [19]

Murai

[11] 4,183,091
[45] Jan. 8, 1980

[54] WIRING DEVICE
[75] Inventor: Unosuke Murai, Tokyo, Japan
[73] Assignee: Taiko Denki Company Limited, Japan
[21] Appl. No.: 886,947
[22] Filed: Mar. 15, 1978
[30] Foreign Application Priority Data
Mar. 19, 1977 [JP] Japan .................. 52-30918
[51] Int. Cl.² .............................................. G11C 13/00
[52] U.S. Cl. ........................................ 365/51; 324/51;
365/51;64;106;148;164;201
[58] Field of Search ................ 40/52; 324/65, 73 R,
324/73 PC, 51, 53
[56] References Cited
U.S. PATENT DOCUMENTS

| | | | |
|---|---|---|---|
| 2,892,153 | 6/1959 | Neill | 324/66 |
| 3,052,842 | 9/1962 | Frohmann | 324/66 |
| 3,407,480 | 10/1968 | Hill | 324/66 |
| 3,514,552 | 5/1970 | Smith | 324/66 |
| 3,867,692 | 2/1975 | Esch | 324/66 |
| 3,931,574 | 1/1976 | Curtis | 324/73 PC |
| 4,030,029 | 6/1977 | Cox | 324/66 |

Primary Examiner—Terrell W. Fears
Attorney, Agent, or Firm—Robert E. Burns; Emmanuel J. Lobato; Bruce L. Adams

[57] ABSTRACT

This invention relates to a wiring device used for combining a plurality of lead wires for wiring in electronic devices, etc., and more particularly it relates to a wiring device which is capable of making automatic indications of the starting end, terminal end and intermediate route for every wire to be set as well as automatic checking for errors after completion of wiring.

8 Claims, 7 Drawing Figures

WIRING DEVICE

BRIEF DESCRIPTION OF THE DRAWINGS

The accompanying drawings illustrate an embodiment of this invention, wherein.

DETAILED DESCRIPTION OF THE INVENTION

Figure 1:
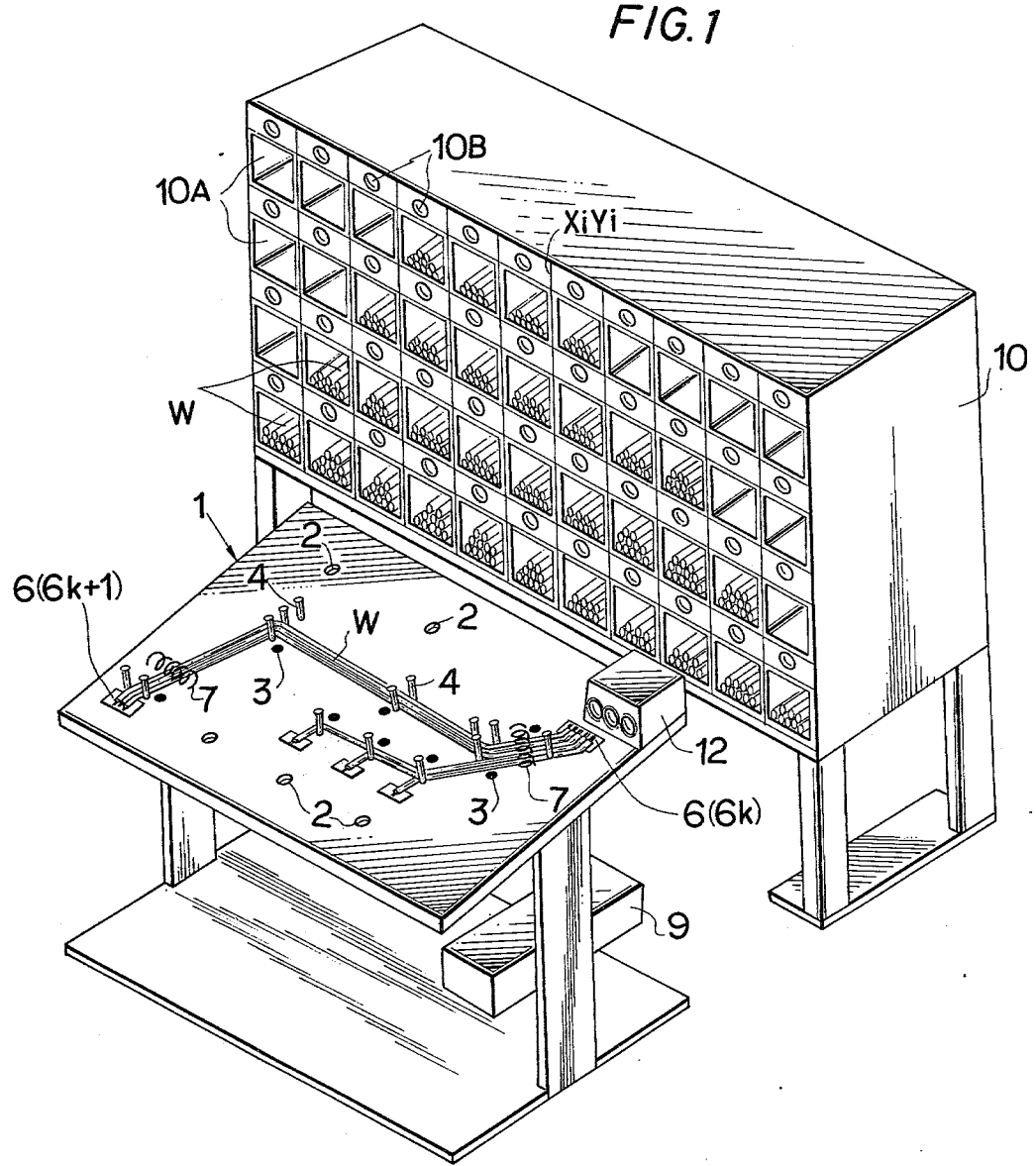
FIG. 1 is an arrangement plan of the wiring device according to this invention.

A great many of wires are usually used for connecting the parts in the communication apparatus, domestic electrical devices, etc., so that such wiring is generally practiced not individually for the respective wires but by previously selecting the number and type (kind of wire, color, length, etc.) of wires required for the desired wiring, with the connectors and/or terminals being adapted to the wire ends where necessary, arranging these combined wires into the configurations and positions suited for the desired wiring, further bundling and integrating these wires by means of bands or the like for maintaining the arranged configurations and positions, and connecting the integrated wire bundles between the electronic parts by soldering or other means, thereby to accomplish the desired wiring operation with ease and security.

Usually, such wiring operation is performed by using a plugboard (harness board) which has pasted thereon a drawing indicating the required type of wires, wire number, arrangement of each wire from its start to end, refracted sections, distances between each refracted section and the start and end of each wire, dimensional sizes of said sections, required types of connectors and terminals adapted, etc. Other auxiliary means such as guide pins, springs, etc., are also used for securing the wires at both ends thereof or at the refracted points.

The worker selects the required type of wire from the indication on said drawing or other previously prepared list and carries out wiring according to the instructions concerning the order of wiring, positions, arrangement, etc., given on the drawing.

This method however proves defective in many respects. For instance, in case the wires to be incorporated are numerous as in the domestic electrical devices where usually 150 to 200 wires or even greater number of wires are required, the drawing becomes very complicated, and it is not easy to properly arrange the respective wires and many erronous wiring could occur. The worker is fatigued very much as he is required to keep attentive so as to prevent miswiring, and hence the working efficiency is excessively lowered.

Normally, the number of the wires that can be properly wired by one worker, even a skilled worker, by correctly understanding and memorizing the wiring instructions, is limited to approximately 50, so that in case there are involved more number of wires to be arranged, the work is usually divided among the plural workers and hence many wiring boards are necessitated. Further, the completed wiring must be checked for any erronous wiring either macroscopically or by using a complicated inspection device.

In an attempt to eliminate such defects, a device has been proposed in which a matrix board with same dimensions as the plugboard is integrally fixed to the back side of the plugboard and a plurality of LED lamps are set on the plugboard so that any desired wiring route will be indicated by lighting the associated LED lamps.

However, many of the domestic electrical devices such as tape recorders or VTR involve numerous wires and further, each wire is branched successively at close intervals, so that if it is attempted to beforehand adapt the respective LED lamps to all required positions, it is necessary to mount the LED lamps at as small intervals as about 5 mm. Thus, it is required to mount as many as about 20,000 (120×180) pieces of LED lamps even for a standard-size (600 mm×900 mm) plugboard. Even if such LED lamps are used only at the minimum necessary parts, there is actually required a large-sized (16-bit) memory processing unit, thus necessitating a sizable dimensional enlargement of the apparatus and elevated cost.

The present invention is intended to provide a wiring device which is perfectly free of the defects inherent in the conventional devices such as above-said.

Now the invention is described in detail in accordance with an embodiment thereof as illustrated in the accompanying drawings.

Referring to FIG. 1, reference numeral 1 indicates a plugboard (harness board) which has provided therein a plurality of through-holes 2, 2, and light-emitting elements such as LED lamps 3 are mounted only in those 2A, 2A of the holes 2, 2 which are located along the wiring route indicating the starting and terminal ends and the intermediate course of each wire W to be set, that is, the LED lamps 3 are provided only in a number necessary for making one harness.

Figure 2A:
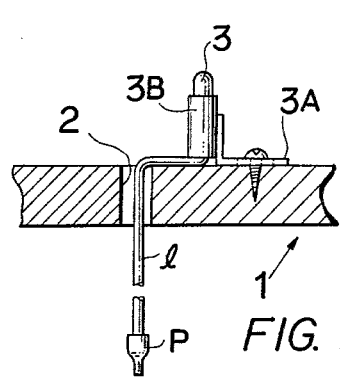
FIGS. 2A, 2B and 2C are illustrative drawings showing means for fixing light-emitting elements to the plugboard.
Figure 2B:
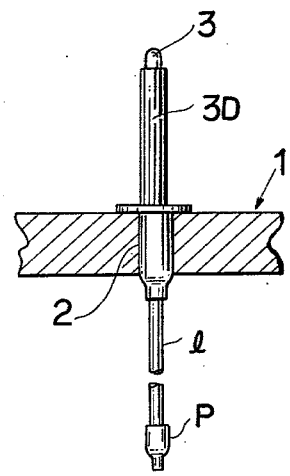

For securely fixing each said LED lamp to the harness board 1, there may be employed a method such as shown in FIG. 2A in which an L-shaped fixing element 3A is first adapted to the socket 3B of the light-emitting element 3 and then a screw is driven into the upper surface of the harness board 1 through an elongated slot 3C formed in said L-shaped fixing element 3A, or a method such as illustrated in FIG. 2B in which a guide pin 3D is adapted in each said hole 2 and the element 3 is mounted at the end of said guide pin 3D.

Figure 2C:
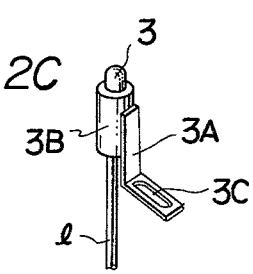

According to the method of FIG. 2, it is possible to move the luminous element 3 along the elongated slot 3C or about the screw, allowing suitable adjustment of the light-emitting element at the desired position without removing the screw. In the case of the method of FIG. 2B, said pins 3D can double as the guide pins 4 which are normally planted close to the holes 2 in the harness board 1.

A lead wire 1 is connected to the light-emitting element 3, said lead wire 1 carrying at its other end a plug P which can be fitted into a corresponding jack 5A on the surface of a matrix board 5 provided separately from the harness board.

Numeral 6 indicates an electroconductive contact piece adapted for confirming the operation at the starting or terminal end of the wire, and a coil spring 7 is provided close to each said contact piece 6 for the purpose of fixing the wire in position.

Figure 3:
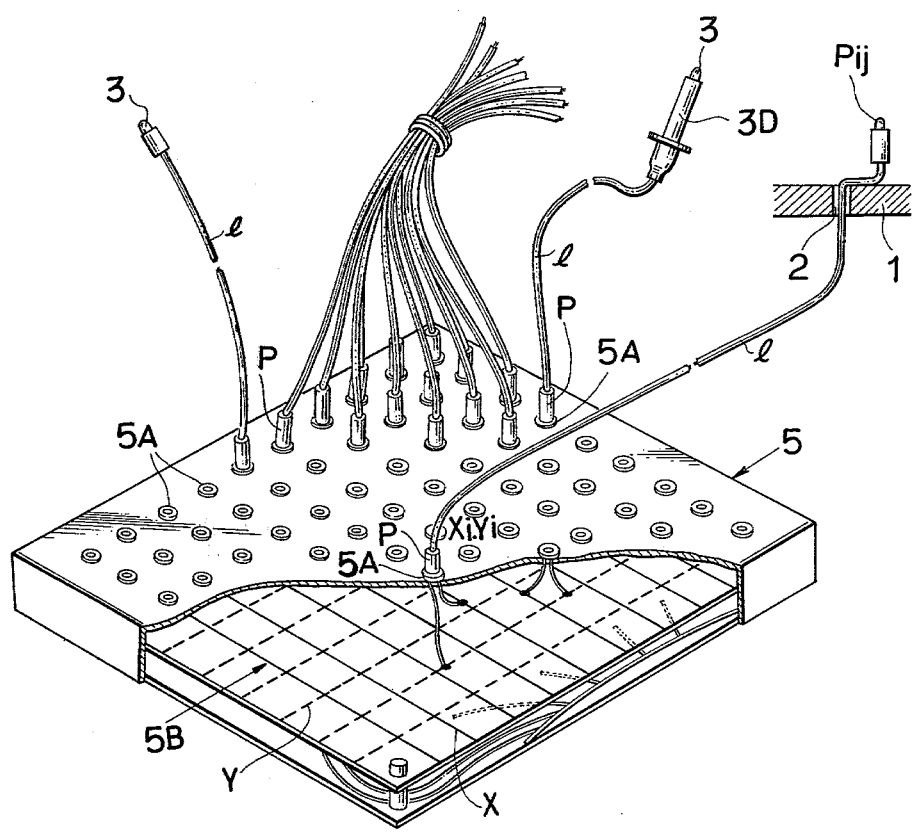
FIG. 3 is a partly cut-out perspective view of a matrix board illustrating the connections with the light-emitting elements.

The matrix board 5 has a geometry such as shown in FIG. 3. As said above, the plug P of each element 3 is fitted into a corresponding jack 5A on the matrix board 5, and the respective lead wires 1 each extending from the starting end to the terminal end are led out to the positions required for clarifying the route on the harness board 1 for every step, and the LED elements 3 at the ends of said respective lead wires are illuminated in succession.

Figure 4:
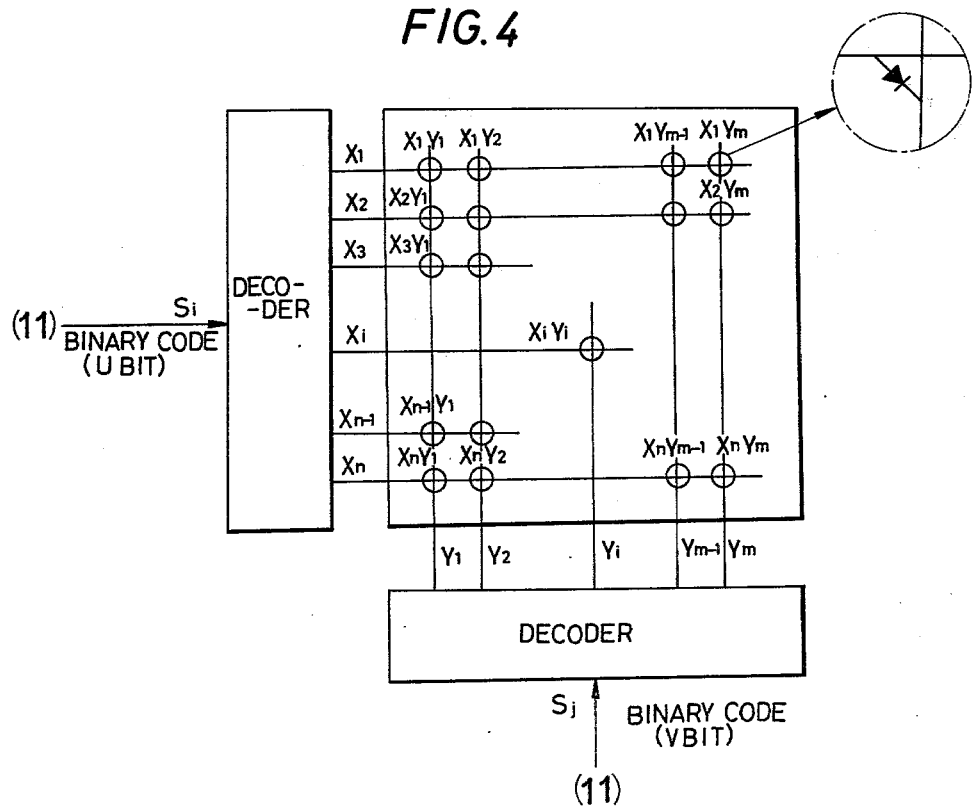
FIG. 4 is a diagram illustrating the relation between the matrix circuit and its peripheral equipments.

The order of plug-in, as shown in FIG. 4, may be: $X_1Y_1 \cdot X_1Y_2 \cdot X_1Y_3 \ldots X_1Y_m, X_2Y_1 \ldots X_2Y_m, X_1Y_1 \cdot X_2Y_1 \ldots X_nY_1$, or $X_1Y_2 \ldots X_nY_2$. As simple an arrangement as possible is preferred for facilitating the ensuing programming.

If it is supposed that the light-emitting elements 3 are arranged in the order of $x_iy_i \ldots x_iy_m$ from the starting end to the terminal end in the Kth step, then these addresses are converted into a binary code and read into a memory device 9 by an input device 8.

Figure 5:
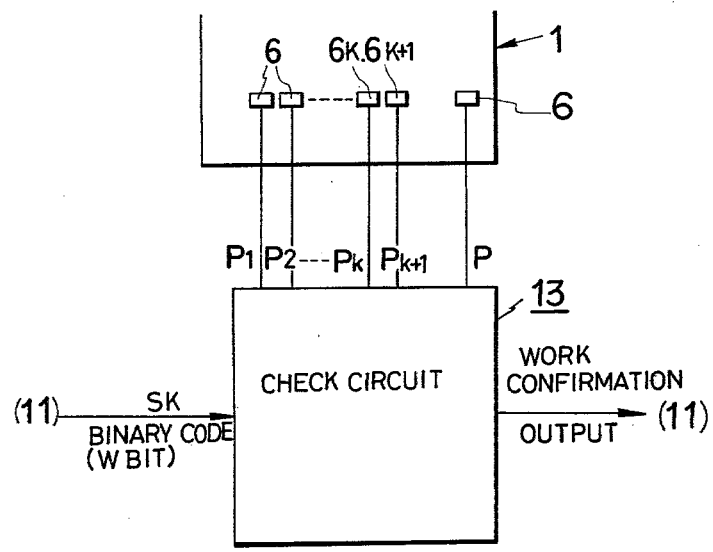
FIG. 5 is a diagram illustrating the relation of connection between the information input/output section of the check circuit and the plugboard.
Figure 6:
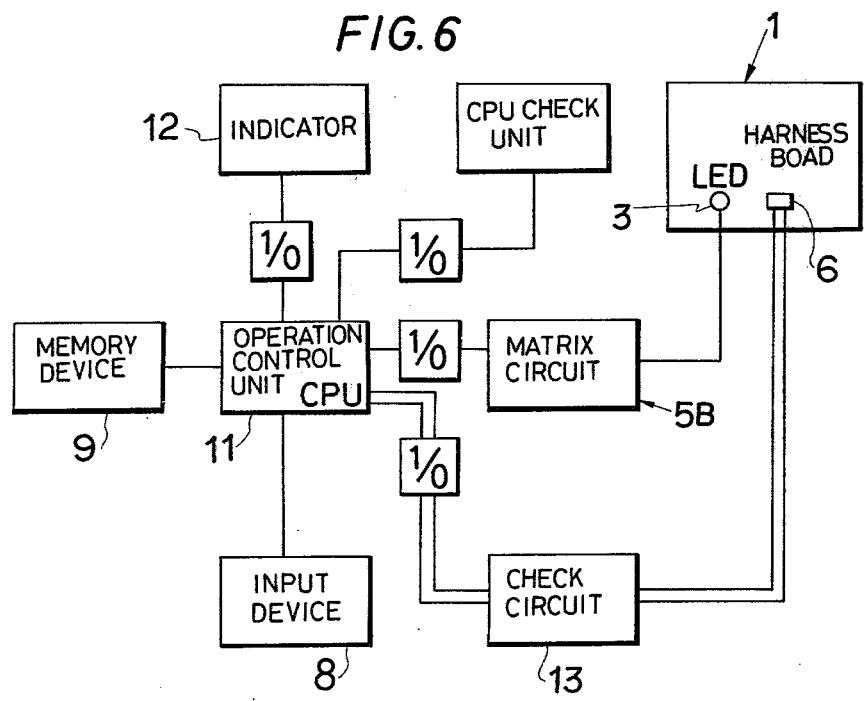
FIG. 6 is a block diagram of the system used in this invention.

Also, the binary-coded information of the addresses of $P_k \cdot P_{k+1}$ of the electroconductive contact pieces 6 (see FIG. 5) for confirming the operation corresponding to this step as well as the binary-coded information of length, type and color of the wire W used in this step or the addresses $X_i Y_i$ of the case 10 containing said wire are stored in the memory device 9 as a set of information for the Kth step.

In operation, the binary code for specifying every set of information, that is, the length, type and color of the wire W to be adapted and the connector used therefor or the address $X_i Y_i$ of the case 10 containing them, a series of binary codes $S_i \cdot S_j$ for specifying the address $x_iy_i$ on the matrix board 5 and the binary code for specifying the address $P_k \cdot P_{k+1}$ of the electroconductive contact pieces 6 close to the starting and terminal ends for confirming the operation are assigned according to the program.

The binary code SK is called out by the operation control unit 11 from the memory device 9 according to the program, and this sign is sent to the matrix circuit 5B, indicator 12 and then to check circuit 13.

Thus, the jack 5A of said specified address $X_iY_i$ on the matrix board 5 operates the associated luminous element 3 in a specified state, and the light-emitting element $P_{ij}$ at the other end of the plug P inserted into said jack 5A is either lighted or flickered at time intervals specified by the control order on the harness board 1 (see FIG. 3).

The length, type and color of the wire W, the connector used therefor, etc., are indicated on the indicator by way of letters, signs, etc., or directly indicated by lightening or flickering of the lamps 10B provided above the partition shelves 10A in a container case 10 provided separately from the indicator 12. The address $P_k \cdot P_{k+1}$ of the check circuit 13 (FIG. 5) is selected (the end of said address extends onto the harness board 1), and the worker performs wiring from the starting end to the terminal end according to the route indicated by successive lighting of the elements 3 and he finally contacts both ends of the wire W to the electroconductive contact pieces $6_K \cdot 6_{K+1}$, whereupon the check circuit 13 outputs the work confirmation signal to the operation control unit 11, allowing said unit 11 to proceed on to the next working step. Said work confirmation signal is sent from the operation control unit 11 to the indicator 12, and the completion of the work is indicated by means of light or sound.

Now the sequence of operation of the device according to this invention is described.

First, the type of wire W to be wired is selected. For this, various types of wires are beforehand stored on the partitioned shelves 10A in a container case 10 according to the classification, and the identifying numbers are put for the respective partition shelves. Thus, when the memory device 9 is actuated, the indicator 12 at a corner of the harness board 1 indicates the number of the shelf 10A where the required type of wires are stored.

In this case, instead of using the number indicator 12, the lamp 10B above the particular shelf 10A may be directly lighted to effect the similar indication. For allowing correct arrangement of the selected wire W along the required position on the harness board 1, the required number of LED lamps 3, 3 located on or alongside the wiring line to indicate the route all the way from the starting end to the terminal end are lighted or flickered one by one successively by the next signal from the memory device 9 through the matrix circuit 5B.

Such lighting or flickering of the LED lamps 3, 3 allows correct wiring all the way along the specified route from the starting point to the terminal end, and when both ends of the wire are electrically contacted with the electroconductive contact pieces 6, 6 positioned close to both ends of the wire route, such contact is confirmed by the check circuit 13.

The LED lamps continue their flickering operation for a predetermined period of time or by a predetermined number of times until both ends of the wire are electrically contacted with the contact pieces 6, 6, that is, until the correct wiring is accomplished all the way along the specified route from the starting end to the terminal end. The lighting duration, frequency and speed of every LED lamp can be suitably changed, and proper selection of such speed makes it easier to notice the starting and terminal ends.

When the above-said work is completed, the work end confirmation signal is sent to the indicator 12 from the operation control unit 11 and the end of the work is informed by way of light or sound, whereupon the operation control unit 11 gives an instruction to proceed on to the next program 4.

The above-said indicating operation is repeated until the entire harness wiring work is completed, and when such work is completed entirely, the LED lamps 3 are no longer lighted. Thus, completion of the wiring work is noticed by non-indication or non-lighting of the indicator 12 which selects the next wire.

As this invention is composed of the above-described arrangements, the worker has only to perform the work by merely following the instructions given by this device, and should any mistake be committed in the process, the correct working position and order are automatically informed to have such mistake corrected, and only when the work has been accomplished correctly, the next work is indicated.

Therefore, the worker has no necessity of memorizing the plurality of wires or becoming skilled in wiring work and can accomplish the correct wiring with ease and in a short time by merely following the instructions of the device.

Further, because of secure and reliable work, there is required no inspection to check for any error in wiring after assemblage, that is, after completion of the wiring work, and hence the working efficiency is further improved.

Moreover, according to this invention, the matrix is not formed on the harness board but a matrix board is separately provided and the lead wires are taken out from a total of 240 spots, that is, the crossing points of 15×16 pieces of wires and the LED lamps adapted to the ends of these extended out lead wires are set at the required positions on the harness board, so that the number of the LED lamps required can be minimized and also an appreciable miniaturization of the apparatus can be realized as the memory processing unit can be reduced in required capacity from, for example, 16-bit to 8-bit scale.

What is claimed is:

1. A wiring device comprising a harness board, a plurality of contact pieces mounted on said harness board, a matrix board separate from said harness board and having a multiplicity of contact points, a plurality of light elements mounted at selected positions on said harness board and electrically connected to select contact points on said matrix board, means for storing a plurality of wires of different lengths and sizes, indicator means for identifying different wires, computor means controlling said wire indicator means and controlling said light elements through said matrix board, and means for programming said computor means to direct the successive application of wires to said harness board in the manner that for each wire said computor means controls the activation of said wire indicator means to identify the wire to be used and controls said light elements to identify spaced contact pieces to which said wire is to be connected and to indicate the routing of said wire between said contact pieces.

2. A wiring device according to claim 1, in which said means for storing a plurality of wires comprises a plurality of separate wire storage compartments adjacent said harness board and in which said means for identifying different wires comprises a visual indicator associated with each of said compartments.

3. A wiring device according to claim 1, further comprising checking circuit means including indicating means for indicating when said wires are correctly connected.

4. A wiring device according to claim 3, in which said indicating means of said checking circuit means comprises an indicator light on said harness board.

5. A wiring device according to claim 1, in which said harness board is mounted above said matrix board and has a plurality of through holes, and in which each of said light elements has a lead which extends through one of said through holes and is connected to a contact point on said matrix board.

6. A wiring diagram according to claim 5, in which means for mounting said light elements on said harness board includes means for adjusting the position of said light elements and for securing said light elements in adjusted position.

7. A wiring diagram according to claim 5, in which said matrix board has a plurality of jacks and in which said leads of said light elements terminate in plugs which plug in said jacks.

8. A wiring diagram according to claim 1, in which said computor means transmits information to said light elements and wire indicating means by binary coding.

* * * * *